US009024291B2

(12) United States Patent
Cho et al.

(10) Patent No.: US 9,024,291 B2
(45) Date of Patent: May 5, 2015

(54) RESISTIVE MEMORY DEVICE AND FABRICATION METHOD THEREOF

(71) Applicant: SK Hynix Inc., Gyeonggi-do (KR)

(72) Inventors: Han Woo Cho, Gyeonggi-do (KR); Hyo Seob Yoon, Gyeonggi-do (KR); Yong Seok Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/975,691

(22) Filed: Aug. 26, 2013

(65) Prior Publication Data

US 2014/0319445 A1    Oct. 30, 2014

(30) Foreign Application Priority Data

Apr. 25, 2013    (KR) .......................... 10-2013-0046088

(51) Int. Cl.
*H01L 47/00*    (2006.01)
*H01L 45/00*    (2006.01)

(52) U.S. Cl.
CPC ............ *H01L 45/06* (2013.01); *H01L 45/1233* (2013.01); *H01L 45/1246* (2013.01); *H01L 45/1293* (2013.01); *H01L 45/144* (2013.01); *H01L 45/1691* (2013.01)

(58) Field of Classification Search
CPC ............ H01L 21/30604; H01L 21/308; H01L 21/76224; H01L 21/764; H01L 21/76802; H01L 21/76814; H01L 21/76843; H01L 21/76877; H01L 23/3677; H01L 23/373; H01L 29/66242
USPC ...................... 257/2, 4–5, E21.614, E21.645; 438/102, 129, 268, 382, 618, 686
See application file for complete search history.

(56) References Cited

U.S. PATENT DOCUMENTS

2010/0237405 A1*    9/2010    Shin .............................. 257/329

FOREIGN PATENT DOCUMENTS

| KR | 100585148 | 5/2006 |
|---|---|---|
| KR | 1020100028910 | 3/2010 |

\* cited by examiner

*Primary Examiner* — Mark A Laurenzi
(74) *Attorney, Agent, or Firm* — IP & T Group LLP

(57) ABSTRACT

A resistive memory device and a fabrication method thereof are provided. The resistive memory device includes a bottom structure including a heating electrode, data storage materials, each of the data storage materials formed on the bottom structure in a confined structure perpendicular to the bottom structure, and having a lower diameter smaller than an upper diameter, an upper electrode formed on each of the data storage materials, and an insulation unit formed between adjacent data storage materials.

7 Claims, 6 Drawing Sheets

RESISTIVE MEMORY DEVICE AND FABRICATION METHOD THEREOF

CROSS-REFERENCES TO RELATED APPLICATION

The present application claims priority under 35 U.S.C. §119(a) to Korean application number 10-2013-0046088, filed on Apr. 25, 2013, in the Korean Intellectual Property Office, which is incorporated herein by reference in its entirety.

BACKGROUND

1. Technical Field

The inventive concept relates to a semiconductor memory device, and more particularly, to a resistive memory device and a fabrication method thereof.

2. Related Art

Resistive memory devices are memory devices using a programmable resistance change material as a data storage node, and a level of data stored in the resistive memory device is divided according to a resistance value of a resistance change material.

Phase-change random access memory devices (PCRAMs) are a typical example of the resistive memory devices. The PCRAMs use a chalcogenide material as a phase-change material, and store data using a difference in a resistance value changed according to phase transition of a phase-change material between an amorphous state and a crystalline state.

Recently, a structure, in which a phase-change material is formed in a confined type and interference between adjacent cells and a reset current are reduced, is suggested, and FIGS. 1A to 1H illustrate a method of fabricating a conventional resistive memory device.

Referring to FIG. 1A, an interlayer insulating layer 103 and a buffer layer 105 are sequentially formed on a semiconductor substrate 101, in which a bottom structure is formed. A first hole 107, exposing a predetermined portion of the semiconductor substrate 101, is formed. A heating electrode 109 is formed in a lower portion of the first hole 107. The interlayer insulating layer 103 may include an oxide, and the buffer layer 105 may include a nitride.

As illustrated in FIG. 1B, a liner insulating layer 111 is formed on the semiconductor substrate including the heating electrode 109. Here, the liner insulating layer 111 may include a material having the same etch characteristic as or similar etch characteristic from the etch characteristic of the buffer layer 105.

As illustrated in FIG. 1C, a first insulating layer 113 is formed on the semiconductor substrate, including the liner insulating layer 111, to fill the inside of the first hole 107. The first insulating layer 113 is planarized and recessed in the first hole 107 to a predetermined height. The first insulating layer 113 may include a material having an etch characteristic that is different than an etch characteristic of the buffer layer 105 and an etch characteristic of the liner insulating layer 111. For example, the first insulating layer 113 may include spin on dielectric (SOD).

As illustrated in FIG. 1D, a spacer insulating layer is formed on the semiconductor substrate, including the first insulating layer 113, and then etched to form a spacer 115 on an inner wall of the first hole 107. The first insulating layer 113 is then removed to form a second hole 117, as illustrated in FIG. 1E.

After the second hole 117 is formed, a second insulating layer 119 is formed on the semiconductor substrate, including the second hole 117. At this time, since the second hole 117 has a structure in which an upper diameter is narrow and a lower diameter is wide, the second insulating layer 119 is buried so that a void is formed in a lower portion of the second hole 117. The second insulating layer 119 may include a material having the same etch characteristic as or a different etch characteristic from the etch characteristic of the buffer layer 105 and the liner insulating layer 111.

Therefore, the second I insulating layer 119 is removed to a predetermined target depth through an etching process to obtain a keyhole structure as illustrated in FIG. 1G.

After the keyhole structure is formed, a phase-change material pattern 121 and an upper electrode 123 are formed in the keyhole structure, as illustrated in FIG. 1H.

The PCRAM having the keyhole structure is suggested to overcome a limit of an exposure and etch process for forming a fine contact having a nano critical dimension, and the PCRAM is advantageous to reduce a reset current through reduction in a contact area between the phase-change material pattern 121 and the heating electrode 109.

However, in the ultra-fine memory device, the size of the unit memory device may reduced as illustrated in FIGS. 1A to 1G, but a space between cells is also reduced. In particular, when a crystalline state of the phase-change material is changed by Joule's heat, heat transferred to the phase-change material pattern 121 from the heating electrode may be transferred to adjacent cells. Thus, a thermal effect between the adjacent cells is increased as the space between the cells is reduced.

Further, to form the keyhole structure using the conventional fabrication method of the PCRAM, the process of forming the spacer, the process of forming the first insulating layer, the process of removing and recessing the first insulating layer, the process of forming the second insulating layer, and the process of removing the second insulating layer are performed. Therefore, the fabrication process is complicated, and thus a processing time is also increased.

SUMMARY

An exemplary resistive memory device may include a bottom structure including a heating electrode; a plurality of openings extending substantially perpendicular to a surface of the bottom structure, each opening, of the plurality of openings, being defined by a structure to have a first diameter, adjacent to the bottom structure, and to have a second diameter, remote from the bottom structure, wherein the first diameter is less than the second diameter; a data storage material formed in each opening of the plurality of openings; an upper electrode formed on the data storage material; and an air gap formed between adjacent data storage materials.

A method of fabricating an exemplary resistive memory device may include forming a first material layer having a first oxidation rate on a semiconductor substrate, on which a bottom structure is formed; forming a second material layer, having a second oxidation rate lower than the first oxidation rate, over the first material layer; patterning the second material layer and the first material layer to form pattern structures; oxidizing surfaces of the pattern structures to form oxide layers; forming an insulating layer on the semiconductor substrate, including the pattern structures having the oxidized surfaces; planarizing the insulating layer to expose an upper surface of the second material layer; forming storage node holes by removing the second material layer and the first material layer from the oxide layers; and forming a data storage material in the storage node holes.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1A:
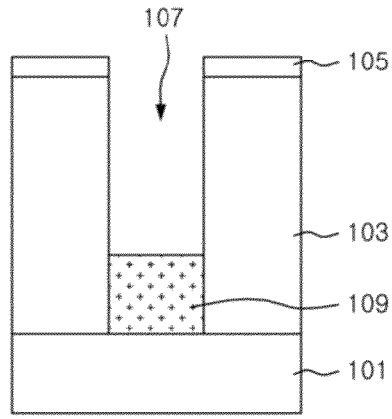
FIGS. 1A to 1H are cross-sectional views illustrating a method of fabricating a conventional resistive memory device.
Figure 1B:
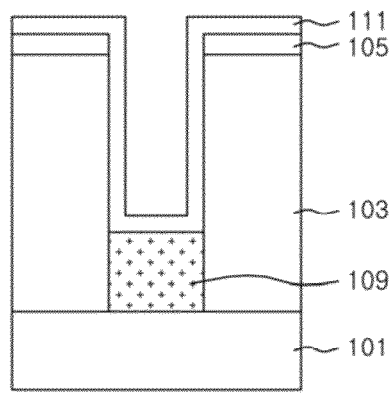
Figure 1C:
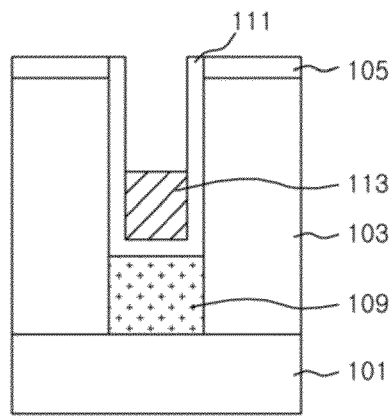
Figure 1D:
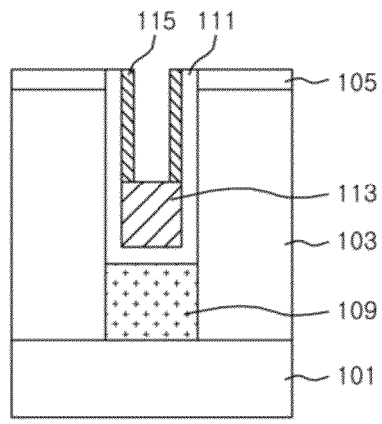
Figure 1E:
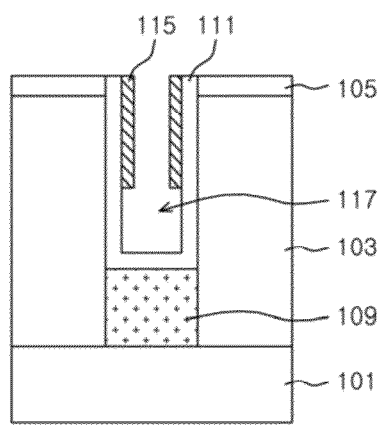
Figure 1F:
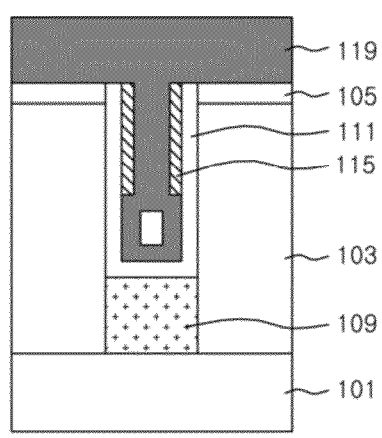
Figure 1G:
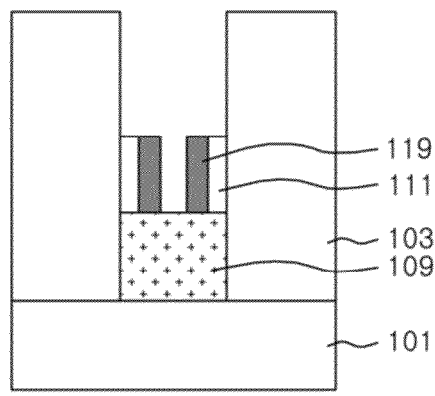
Figure 1H:
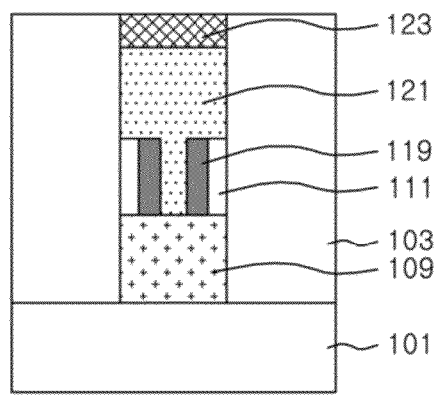

Hereinafter, exemplary implementations will be described in greater detail with reference to the accompanying drawings.

Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. Throughout the disclosure, reference numerals correspond directly to the like numbered parts in the various figures and embodiments of the present invention. Like reference numerals in the drawings denote like elements. It should be readily understood that the meaning of "on" and "over" in the present disclosure should be interpreted in the broadest manner such that "on" means not only "directly on" but also something with an intermediate feature(s) or a layer(s) therebetween, and that "over" means not only directly on top but also on top of something with an intermediate feature(s) or a layer(s) therebetween, FIGS. 2A to 2F are cross-sectional views illustrating an exemplary method of fabricating an exemplary resistive memory device.

Figure 2A:
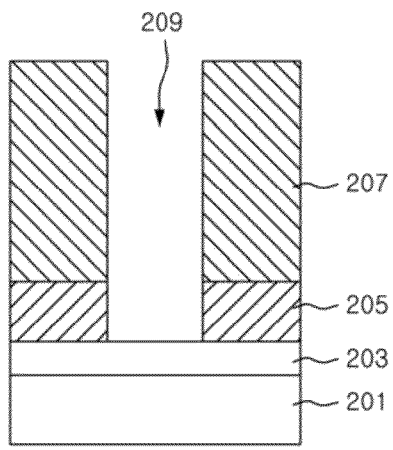
FIGS. 2A to 2F are cross-sectional views illustrating an exemplary method of fabricating an exemplary resistive memory device.

Referring to FIG. 2A, a semiconductor substrate 201 is formed. A bottom structure 203, including an access device (not shown) and a heating electrode (not shown), is formed on the semiconductor substrate 201. A first material layer 205, having a first oxidation rate, and a second material layer 207, having a second oxidation rate lower than the first oxidation rate, are sequentially formed on the bottom structure 203. The first material layer 205 and the second material layer 207 are patterned to form a hole 209. Thicknesses of the first material layer 205 and the second material layer 207 may be predetermined. The thickness of the first material layer 205 may be smaller than the thickness of the second material layer 207.

In an exemplary implementation, the first material layer 205 may include silicon germanium SiGe and the second material layer 207 may include polysilicon. In an alternative exemplary implementation, the first material layer 205 may include doped polysilicon and the second material layer 207 may include undoped polysilicon.

A combination of the materials for the first and second material layers 205 and 207 is not limited thereto, and any combination in which the oxidation rate of the first material layer 205 is larger than the oxidation rate of the second material layer 207 may be used.

Further, if the first material layer 205 includes SiGe, then the oxidation rate of the first material layer 205 may be controlled based on a concentration of Ge. Therefore, the concentration of Ge may be changed according to a required size of the unit memory device. As the oxidation rate of the first material layer 205 is increased, a contact area between a data storage material (to be formed later) and the bottom structure (heating electrode) may be reduced, and a reset current may be reduced.

The first material layer 205 and the second material layer 207 may be patterned in a circular pattern or in a line-shaped extending to predetermined direction.

Figure 3:
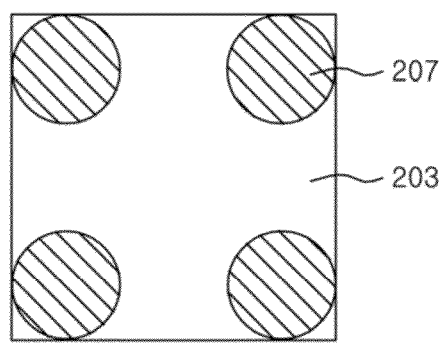
FIG. 3 is an illustrative view illustrating an example of a pattern structure illustrated in FIG. 2A.
Figure 4:
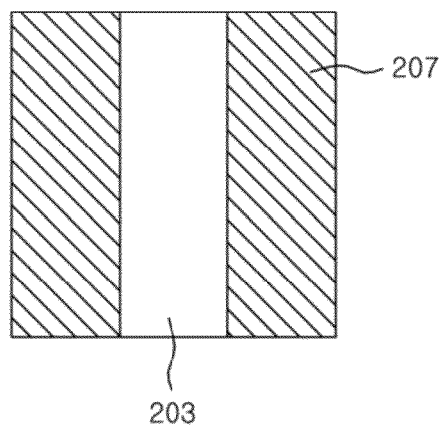
FIG. 4 is an illustrative view illustrating another example of a pattern structure illustrated in FIG. 2A.

FIGS. 3 and 4 are illustrative views of an example of the pattern structure illustrated in FIG. 2A. FIG. 3 illustrates that the first material layer 205 and the second material layer 207 are patterned in a circular pattern, while FIG. 4 illustrates that the first material layer 205 and the second material layer 207 are patterned in a substantially rectangular pattern.

Figure 2B:
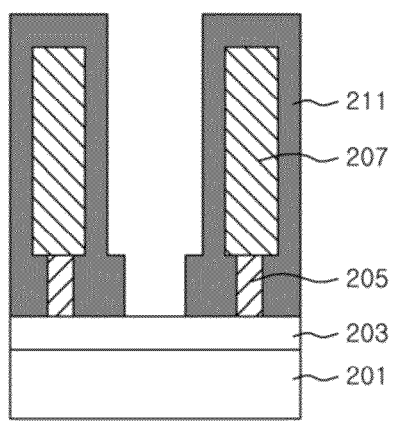

Referring to FIG. 2B, surfaces of the first material layer 205 and the second material layer 207 are oxidized to form an oxide layer 211. As described above, since the first material layer 205 has an oxidation rate that is higher than the oxidation rate of the second material layer 207, the oxide layer 211 is formed to be thicker on an outer surface of the first material layer 205 than on an outer surface of the second material layer 207.

Figure 2C:
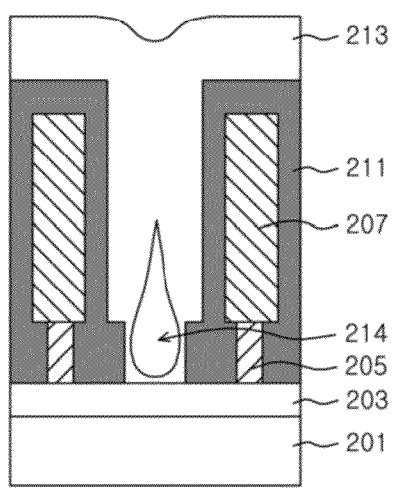

As illustrated in FIG. 2C, an insulating layer 213 is formed on the semiconductor substrate including the oxide layer 211. The insulating layer 213 may include a material having poor step coverage characteristic. The insulating layer 213 may include a nitride having an etch characteristic that is different than an etch characteristic of the oxide layer 211. Since a lower diameter of the hole 209 is reduced by the oxide layer 211, and the step coverage of the insulating layer 213 is poor, the insulating layer 213 does not completely fill a lower portion of the hole 209. Therefore an air gap 214 is intentionally generated in the lower portion of the hole 209, and serves as an insulation unit configured to prevent interference between cells.

Figure 2D:
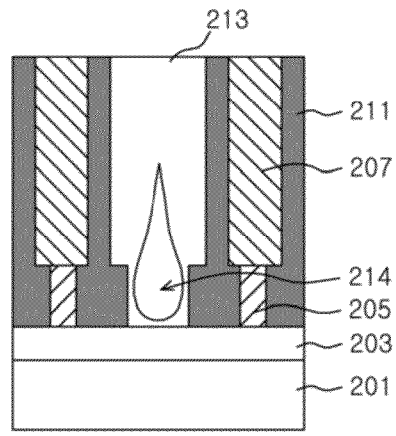

As illustrated in FIG. 2D, the insulating layer 213 is planarized to expose an upper surface of the second material layer 207.

Figure 2E:
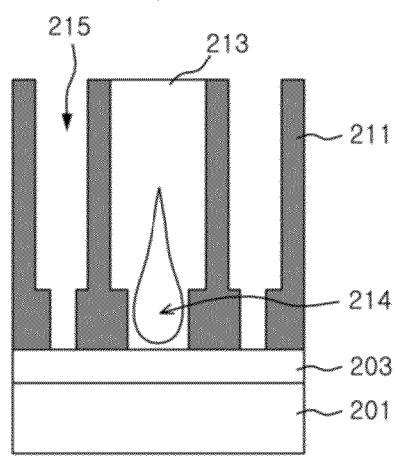

When the upper surface of the second material layer 207 is exposed, the second material layer 207 and the first material layer 205 may be removed. FIG. 2E illustrates a state in which second material layer 207 and the first material layer 205 are removed to form a storage node hole 215.

It can be seen from FIG. 2E that the storage node hole 215 has a lower diameter that is smaller than an upper diameter. Therefore a keyhole structure may be simply formed without complicated processing, such as a forming a spacer, forming an insulating layer, and forming the insulating layer.

Figure 2F:
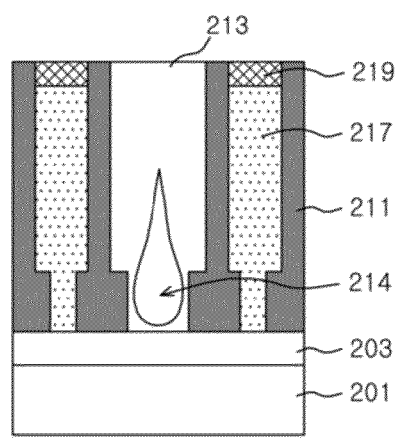

Referring to FIG. 2F, a data storage material 217 and an upper electrode 219 are formed within the storage node hole 215 to form the resistive memory device. The air gap 214 (the insulation unit) is interposed between the unit resistive memory devices, to prevent heat generated in the data storage material 217 from being transferred to adjacent cells.

The data storage material 217 may include, for example, a phase-change material, such as germanium-antimony-tellurium (GST), but the data storage material 217 is not limited thereto, and may include, for example, a perovskite or a transition metal oxide.

The exemplary resistive memory device may include the data storage material 217 formed on the bottom structure, which includes the heating electrode, in a direction substantially perpendicular to the bottom structure. The data storage material 217 may have a lower diameter that is smaller than an upper diameter. The exemplary resistive memory device may further include the upper electrode 219, which is formed on the data storage material 217, and the insulation unit (the air gap 214) formed between adjacent data storage materials 217.

The above exemplary implementation of the present invention is illustrative and not limitative. Various alternatives and equivalents are possible. The invention is not limited by the exemplary implementation described herein. Nor is the invention limited to any specific type of semiconductor device. Other additions, subtractions, or modifications are obvious in view of the present disclosure and are intended to fall within the scope of the appended claims.

What is claimed is:

1. A method of fabricating a resistive memory device, the method comprising:

forming a first material layer having a first oxidation rate on a semiconductor substrate, on which a bottom structure is formed;

forming a second material layer, having a second oxidation rate lower than the first oxidation rate, over the first material layer;

patterning the second material layer and the first material layer to form pattern structures;

oxidizing surfaces of the pattern structures to form oxide layers;

forming an insulating layer on the semiconductor substrate, including the pattern structures having the oxidized surfaces;

planarizing the insulating layer to expose an upper surface of the second material layer;

forming storage node holes by removing the second material layer and the first material layer from the oxide layers; and forming a data storage material in the storage node holes, wherein an oxide layer on a surface of the first material layer is thicker than an oxide layer formed on a surface of the second material layer.

2. The method of claim 1, wherein the forming the insulating layer comprises:

forming an air gap in the insulating layer, between the pattern structures.

3. The method of claim 1, wherein the first material layer comprises silicon germanium, and the second material layer comprises polysilicon.

4. The method of claim 1, wherein the data storage material comprises a phase-change material, a perovskite, or a transition metal oxide.

5. The method of claim 1, further comprising:

forming, in the storage node holes, an electrode on the data storage material.

6. The method of claim 1, wherein the oxidizing surfaces of the pattern structures comprises:

oxidizing the surface of the first material layer at a faster rate than the surface of the second material layer.

7. The method of claim 3, further comprising:

controlling a thickness of the oxide layer on a surface of the first material layer by varying a concentration of germanium in the first material layer.

* * * * *